United States Patent [19]

Brault

[11] Patent Number: 4,596,761
[45] Date of Patent: Jun. 24, 1986

[54] GRAFT POLYMERIZED SIO$_2$ LITHOGRAPHIC MASKS

[75] Inventor: Robert G. Brault, Santa Monica, Calif.

[73] Assignee: Hughes Aircraft Company, Los Angeles, Calif.

[21] Appl. No.: 718,209

[22] Filed: Apr. 3, 1985

Related U.S. Application Data

[63] Continuation-in-part of Ser. No. 548,180, Nov. 2, 1983, abandoned.

[51] Int. Cl.$^4$ ............................................... G03C 5/00
[52] U.S. Cl. ..................... 430/296; 430/311; 430/325; 430/328; 430/330; 430/942; 430/967
[58] Field of Search .............. 430/313, 323, 325, 330, 430/296, 328, 311, 942, 967; 156/643, 628

[56] References Cited

U.S. PATENT DOCUMENTS

| | | | |
|---|---|---|---|
| 4,195,108 | 3/1980 | Gazard et al. | 428/195 |
| 4,232,110 | 11/1980 | Taylor | 430/313 |
| 4,237,208 | 12/1980 | Desai et al. | 430/270 |
| 4,301,231 | 11/1981 | Atarashi et al. | 430/287 |
| 4,348,472 | 9/1982 | Jagt | 430/195 |
| 4,383,026 | 5/1983 | Hall | 430/325 |
| 4,386,152 | 5/1983 | Lai | 430/269 |
| 4,396,704 | 8/1983 | Taylor | 430/311 |

OTHER PUBLICATIONS

Hattori et al., "A Breakthrough to Plasma Deposited Dry-Developable E-Beam Resist", Society of Plastic Engineers, Nov. 8-10, 1982, Ellenville, N.Y.
Gazard et al., Polymer Engineering and Science, Nov. 1980, vol. 20, No. 16, pp. 1069-1072.
Taylor et al., VISI Electronics: Microstructure Science, vol. 6, 1983, chapter 4.
Taylor et al., J. Vac. Sci. Technol., vol. 19, No. 4, Nov./Dec. 1981, pp. 872-880.

Primary Examiner—John E. Kittle
Assistant Examiner—José G. Dees
Attorney, Agent, or Firm—John A. Sarjeant; A. W. Karambelas

[57] ABSTRACT

This invention provides a process, and delineates typical materials to be used in that process, which enables the use of a precision radiation source to produce a microcircuit resist image accurate to a few micrometers or even fractions of a micrometer. In addition, the process of the invention provides for the dry development of this image, thus insuring the ability to create a finished resist structure exhibiting the same accuracy in dimensions.

Specifically, the invention provides a process in which a positive or negative resist polymer is irradiated under low pressure using a precision radiation source such as an electron beam, masked ion beam, or focused ion beam to generate organic free radicals. After irradiation, the reactive resist polymer is exposed to oxygen or air to create peroxides or hydroperoxides. The peroxides or hydroperoxides are later thermally decomposed to generate organic free radicals which can be reacted with a silicon-containing organic molecule which contains at least one vinyl or other functional group capable of reacting with the organic free radical. The resulting copolymer resist then includes a latent image containing silicon, which can be dry developed using plasma or reactive ion etching techniques.

In another embodiment of this invention, an intermediary non-silicon-containing organic molecule is grafted to the active sites on the resist polymer. The organic molecule is then reacted with a silicon-containing compound, so that it becomes a grafting intermediary between the initial polymeric resist and the silicon-containing compound.

4 Claims, 2 Drawing Figures

GRAFT POLYMERIZED SIO₂ LITHOGRAPHIC MASKS

This is a continuation-in-part of U.S. application Ser. No. 548,180, filed Nov. 2, 1983, abandoned.

BACKGROUND OF THE INVENTION

1. Field of the Invention

The present invention relates to a process for fabricating graft polymerized $SiO_2$ lithographic masks. The process can utilize either a negative or a positive resist polymer; the radiation source used to create the resist image can be any suitable precision radiation source such as electron beam, masked ion beam, focused ion beam; and, the development of the negative resist image into the lithographic mask can be achieved via a dry process in the form of plasma or reactive ion etching.

2. Description of the Prior Art

Fabrication of microcircuits or microcircuit elements requires that the feature size of structures within the circuits be on the order of micrometers or or even submicrometers. This is accomplished by utilizing a precision radiation source capable of producing such submicrometer images, such as electron beam, masked ion beam, focused ion beam, or x-ray, tailoring of the pattern defining medium (resist material) to the specific requirements of the application, and developing the pattern into the final resist structure using a method which reduces the possibility of distortion of the pattern.

Microfabrication typically utilizes a semiconductor substrate which is first coated with a layer of polymeric resist material. The polymeric resist coating is converted to a resist structure by utilizing lithographic techniques. The resist polymeric coating is exposed to patterned radiation and reacts to such radiation in a manner which results in the formation of free radicals. Depending on the type of organic structure which makes up the polymer, the molecules may crosslink with other molecules in the polymer structure or they may degrade, e.g., undergo scission. A polymer which crosslinks after irradiation is described as a negative resist polymer, while a polymer which undergoes scission after irradiation is referred to as a positive resist polymer.

After exposure to a patterned radiation, the resist is developed into the structure required. The structure may become a part of a microcircuit itself or may be used as a masking device to permit subsequent processing of the substrate to yield the desired microcircuit.

Use of a precision radiation source such as an electron beam, and the development of particular polymer and copolymer resists to accomodate such radiation source are illustrated in recent U.S. Patents and publications.

Electron beam sensitive negative resists have been described by Desai et al., in U.S. Pat. No. 4,237,208. Desai et al. utilize a silicon-containing polymer to provide sensitivity to electron beam radiation and good contrast in the developed resist. The development process utilizes a solvent or solvent mixture to remove the resist in areas which have not been irradiated. The remaining resist structure is referred to as a negative resist structure. Additional examples of electron beam sensitive negative resists are provided in U.S. Pat. No. 4,301,231 by Atarashi et al. and in U.S. Pat. No. 4,348,472 by Jagt. The latter U.S. patent provides for the use of copolymers. Copolymers have frequently been utilized to obtain resist characteristics which cannot be obtained from an individual resist polymer.

In U.S. Pat. No. 4,195,108, Gazard et al. describe the use of an initial resist polymer which is exposed to electron beam radiation, followed by a grafting reaction with an appropriate monomer to enable production of a form of copolymer with a significantly different solubility than the initial resist polymer. The grafting reaction is achieved by placing the irradiated, resist-coated substrate into a liquid solution containing the monomer to be grafted to the resist polymer. The liquid phase reaction described requires a period of one day or more, evidently to permit diffusion of the monomer into the polymeric film. Use of this process permits use of electron beam radiation with initial resist polymers which are not sufficiently sensitive to such radiation in themselves to generate a patterned resist capable of development into a resist structure.

Additional description of the above process is provided in M. Gazard et al. "Lithographic Technique Using Radiation-Induced Grafting of Acrylic Acid into Poly(Methyl Methacrylate) Films," Polymer Engineering and Science 20, 1069–1072 (1980). This 1980 article describes shorter reaction periods of from one to three hours for the liquid phase reaction.

Use of solvent to develop the patterned image from the resist polymer or copolymer is not without disadvantages. The resist polymer or copolymer often absorbs solvent, resulting in various distortions of the patterned image even after the solvent is removed. G. N. Taylor et al., "Organosilicon Monomers for Plasma-developed X-Ray Resists", Journal of Vacuum Science Technology, 19 872–880 (1981), suggest that plasma development of negative resists provides a method of avoiding resolution problems encountered with solvent development. A number of copolymer resists were prepared by codissolving a resist polymer with an organometallic monomer in a solvent and spin casting the mixture onto a substrate. After evaporation of the solvent, the mixture of resist polymer and organometallic monomer in film form was exposed to radiation in order to obtain grafting of the monomer onto active sites created by the radiation of the resist polymer. Some homopolymerization of the monomer most probably occurred simultaneously. After removal of the excess monomer, the patterned resist was developed using $O_2$ reactive ion etching techniques.

The organometallic monomer utilized above must be of sufficiently high molecular weight and exhibit a molecular structure which provides the low volatility required during the grafting reaction. At the same time, such monomer, which remains unreacted after the grafting reaction, must be sufficiently volatile to permit removal via vacuum techniques. Thus, the organometallic monomers which meet the requirements of Taylor et al. are limited in scope.

The low volatility limitations placed on the organometallic monomer, as described above, retard the mobility of the monomer and reduce the potential for such monomer to graft to the irradiated polymeric resist. In addition, although excellent uniformity of etching was obtained by Taylor et al., a loss of 50% of the resist image thickness during the etching process was not uncommon.

It is thus desirable to develop a system capable of utilizing both negative and positive resist polymers, and a precision radiation source such as electron beam, masked ion beam, or focused ion beam. In addition, in order to take advantage of the precision images which can be created when these radiation sources are utilized, it is necessary to determine a process for development of the image which will not result in distortion of such image. The prior art has demonstrated that polymers and copolymers can be developed which are sufficiently reactive on exposure to electron beam to produce potentially useful images. Wet solvent development of these images results in distortion, however, which does not permit full utilization of the precisely defined image. Attempts have been made to graft organometallic molecules onto the resist backbone polymer in order to provide a resist which can be dry developed via plasma or reactive ion etching. However, there has not been a satisfactory process achieved which produces a resist image which can be dry developed without substantial loss of the resist or damage to the resist polymer during development.

SUMMARY OF THE INVENTION

Accordingly, it is the purpose of this invention to provide a process, and delineate typical materials to be utilized in that process, which will enable the use of a precision radiation source to produce a microcircuit resist image accurate to a few micrometers or even fractions of a micrometer, which resist image can be dry developed to yield a resist structure of the same accuracy.

Specifically, in accordance with the invention, a process, including the materials for use in such process, is provided in which a positive resist polymer is irradiated at low pressure using an electron beam, masked ion beam, focused ion beam radiation source in order to generate organic free radicals. After irradiation, the reactive resist polymer is exposed to an oxygen-containing atmosphere in order to convert at least a substantial proportion of such free radicals associated with the resist polymer to at least one of the class of peroxides or hydroperoxides. "Associated with" is intended to mean active sites both on the surface of and within the polymeric resist film. The peroxides or hydroperoxides are later thermally decomposed to produce organic free radicals which are capable of reacting with a silicon-containing organic molecule which contains at least one functional group receptive to such free radical reaction. The resulting resist then includes a latent image containing silicon, which can be dry developed using plasma or reactive ion etching techniques. The material used for plasma or reactive ion etching must include, as one of its components, oxygen. The oxygen reacts with the silicon of the silicon-containing organic molecule to produce a silicon dioxide lithographic mask. This mask protects the polymeric resist from the action of the plasma or reactive ion etchant in the patterned, irradiated area during development.

In another embodiment of the above described invention, an intermediary, non-silicon-containing organic molecule is grafted to the free radical active sites on the resist polymer. This organic molecule must contain at least two functional groups, at least one of which is capable of reacting with the free radicals produced upon thermal decomposition of the peroxide or hydroperoxide and at least another of which is capable of reacting with a silicon-containing compound. The intermediary, non-silicon-containing organic molecular material is first reacted with the active sites on the resist polymer. Non-reacted organic molecular material is removed via heat and applied vacuum, after which a silicon-containing compound is reacted with the functional groups on the organic molecular material. Employment of the intermediary, non-silicon-containing organic material permits use of a wider variety of resist polymers and may provide improved yield in the amount of silicon-containing compound grafted to the resist polymer.

In this invention, the initial grafting reaction comprises reaction of either the silicon-containing compound or the intermediary organic molecule with the polymeric resist free radical sites generated upon decomposition of the peroxides and hydroperoxides. The preferred reaction technique is a vapor phase reaction wherein the free radical sites are reacted with the silicon-containing compound or intermediary organic molecule in its vapor form. The advantage of this process method over liquid phase or dry liquid-solid mixture reaction methods is that volatile, mobile monomers can be grafted to the resist polymer. Use of such mobile monomers provides for increased yield in the grafting reaction by facilitating monomer availability at the reactive sites. This is not to exclude the possibility of use of liquid phase or dry liquid-solid mixture reaction methods, as such methods may exhibit advantages when particular reactants are utilized.

The present invention provides considerable flexibility resist fabrication; it provides for the use under low pressure of such precision radiation sources as electron beam, masked ion beam, focused ion beam the use of either positive or negative resist polymeric materials, and development of the negative resist image via a dry process, e.g., plasma or reactive ion etching techniques. In addition, it provides a great potential for reaction of various silicon-containing compounds via use of an intermediary, functional, grafting organic molecule.

DETAILED DESCRIPTION OF THE INVENTION

The present process of the invention, with typical materials to be utilized, permits production of resist structures accurate in dimension to a few micrometers or even fractions of a micrometer.

The resist polymer is applied to a desired substrate, typically by spin coating, to provide a substantially uniform film at least about 100Å thick.

The polymeric resist to be utilized in the process of the invention must be sensitive to the radiation source utilized to create the image. It must also respond to the radiation in a manner which provides organic free radical sites which can be subsequently reacted to generate peroxide and hydroperoxide functional groups associated with the polymeric resist itself.

In the case of negative resist polymers, the following are illustrative, but not all-inclusive:

Poly(vinyl acetate), polybutadiene, poly(methyl vinyl ketone), polystyrene, poly(styreneacrylonitrile), poly(styrene-butadiene), a negative photoresist such as Kodak Microresist 747, poly(acrylamide), poly(a- crylonitrile), polypropylene, poly(ethyl acrylate-co-glycidyl methacrylate), poly(vinyl ethyl ether), polyimides such as DuPont Pyraline, e.g., PI 2555, poly(methyl acrylate), poly(benzyl acrylate), poly(propyl acrylate), poly(butyl acrylate), and poly(cyclohexyl acrylate).

In the case of positive resist polymers, the following are illustrative, but not all-inclusive:

Poly(isobutylene), poly(methyl methacrylate), poly(isopropyl methacrylate), poly(t-butyl methacrylate), poly(isoprene), poly(n-butyl methacrylate), poly(methacrylamide), and poly(methacrylonitrile).

The film-covered surface is then exposed to a precision radiation source such as electron beam, masked ion beam, focused ion beam under low pressure. The irradiation is utilized to generate organic free radicals associated with the polymeric resist in a desired predetermined pattern. It is readily apparent that the pattern to be utilized in the practice of this invention can be any pattern within the limitations of radiation resolution and development capabilities, and which would be useful in the fabrication of a microchip or as a mask to be used for subsequent microchip processing.

Soon after irradiation, the resist-covered surface is exposed to an oxygen-containing atmosphere, e.g., air, to permit the formation of peroxides and/or hydroperoxides at a substantial proportion of the organic free radical sites created within the polymeric resist by the irradiation. Conversion of the organic free radical sites to peroxides and/or hydroperoxides, which can later be thermally decomposed to regenerate free radicals, provides a method of storing the reactive free radicals for later use.

Figure 1:
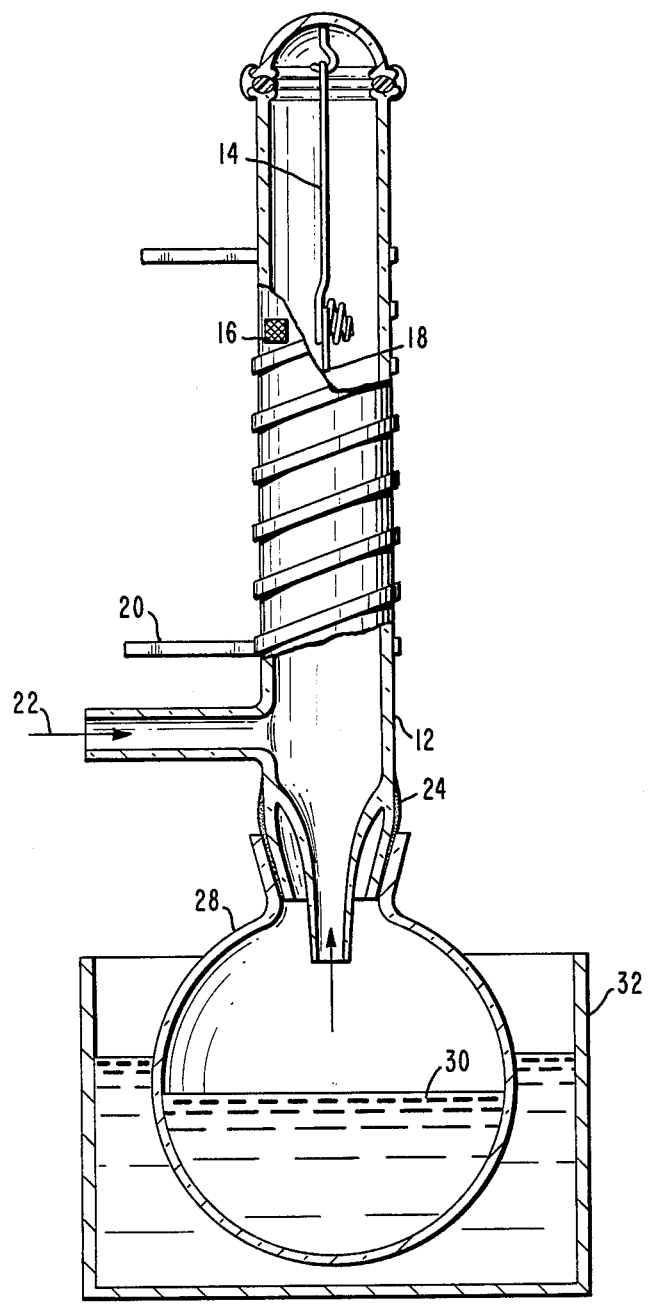
FIG. 1 depicts a schematic of a typical apparatus used in the preferred vapor phase method of reaction of the irradiated resist polmer with either the intermediary grafting non-silicon-containing organic molecule and/or the silicon-containing compound.

The polymeric resist with associated peroxides and/or hydroperoxides is subsequently reacted with either a silicon-containing or non-silicon-containing compound to provide a grafted structure. In the preferred grafting method, the microchip, including imaged and reacted resist film, is then placed in a vapor-phase grafting reactor, a laboratory version of which is shown in FIG. 1. The reactor comprises a short column 12 and a reactant-containing flask 28. These two major sections of the reactor are joined using a ground glass fitting 24. Each section can be heated independently, the column 12 via a tape heater 20 and the flask 28 via an oil bath 32. It will be obvious to one skilled in the art that the type of equipment utilized for manufacture of large quantities of microchips would vary considerably from the laboratory apparatus shown in FIG. 1, which is merely exemplary for purposes of illustrating the process of the invention.

The microchip 18 is suspended in the column 12 using a holder 14, and the reactive material 30 to be grafted to the active sites on the resist film of the microchip is placed in the flask 28. A vacuum source, not shown, is attached to the vacuum inlet 22 to the column 12. Oxygen is then removed from the system, utilizing the vacuum source, after which the system is sealed.

In the first embodiment of the invention, a silicon-containing compound with at least one functional group capable of reacting with the free radicals to be generated on thermal decomposition of the peroxides and hydroperoxides is placed in the flask 28.

Illustrative silicon-containing compounds, not all-inclusive of those capable of utilization, include:

Vinyltrimethylsilane, γ-methacryloxypropyltrimethoxysilane, vinylmethyldiethoxysilane, vinyltriacetoxysilane, vinyldimethylethoxysilane, vinyl-trichlorosilane, vinyltrimethoxysilane, vinyldimethoxyethylsilane, divinylmethylchlorosilane, vinylmethydiacetoxysilane, vinyldimethylethoxysilane, vinylethyldichlorosilane, vinylmethyldichlorosilane, phenylvinyldichlorosilane, vinyltriphenosxysilane, triphenylvinylsilane, trivinylmethylsilane, trivinylethoxysilane, 1,3,5-trivinyl-1,3,5-trimethylcyclotrisiloxane, 1,3,5,7-tetravinyltetramethylcyclotetrasiloxane, 3-methacryloxypropyltris(methoxyethoxy)silane, 3-methacryloxypropyltris(triomethylsiloxy)silane, 3-methacryloxypropyltrichlorosilane, 3-methacryloxypropyltrimethoxysilane, and N-(3-acryloxy-2-hydroxypropyl)-3aminopropyltrithoxysilane.

The flask is then heated to the boiling point of the silicon-containing compound, and the column 12 is heated to a temperature greater than that of the flask. The column temperature is adjusted to provide for thermal decomposition of the peroxides and hydroperoxides associated with the resist film, i.e., to yield active free radical sites associated with the resist polymer. It is also adjusted to prevent condensation of the reactant silicon-containing compound. For example, when the polymeric resist is poly(vinyl acetate) and the silicon-containing compound is vinyltrimethylsilane, the flask temperature is approximately 60° C. and the column temperature is about 120° C.

The reaction is carried out over a period of at least about 20 minutes during which the temperature of the column 12 and the flask 28 are maintained constant. A shorter time period for reaction may be utilized, subject to reaction kinetics of the reactants involved and process conditions such as temperature and pressure. The temperature of the column is monitored using a thermocouple 16 attached to the outside of the column surface. The temperature of the oil bath 32 is adjusted to keep the reactive silicon-containing compound 30 at least at its initial boiling point temperature.

After the reaction, the microchip comprising the substrate, initial resist film, and silicon-containing compound grafted to the initial resist film is removed from the reactor and excess silicon-containing compound is removed by heating in a vacuum at a temperature adequate to permit removal of such compound. The greater the vacuum and higher the permissible temperature, the shorter the time period required for removal of a given silicon-containing compound.

The microchip resist pattern is then dry developed using plasma or reactive ion etching. The material utilized to provide the plasma or reactive ions for the etching process is dependent upon the type of polymeric resist material to be developed. However, materials used for the plasma or reactive ion etching must include oxygen. The oxygen reacts with the silicon of the silicon-containing organic molecule to produce a silicon dioxide lithographic mask. This mask protects the polymeric resist from the action of the plasma or reactive ion etchant in the patterned irradiated area during development.

In the second embodiment of the invention, a non-silicon-containing organic molecule with at least one functional group capable of reacting with a free radical site and at least one functional group capable of reacting with the desired silicon containing compound is utilized as an intermediary grafting agent.

Illustrative, but not all-inclusive, of the non-silicon-containing compounds to be utilized as intermediary grafting agents are the following:

Acrylic acid, methacrylic acid, acryloylchloride, 2,3-epoxypropyl acrylate, glycidyl vinyl ether, allyl alcohol, glycidyl acrylate, vinyl pridine, and glycidyl methacrylate.

Such non-silicon-containing molecule is first reacted with the free radicals generated upon thermal decomposition of the peroxides and hydroperoxides associated with the polymeric resist. The reaction is preferably carried out in the same vapor phase grafting reactor using the same basic techniques previously described for grafting of the silicon-containing compound in the first embodiment. However, a liquid phase technique or a dry solid-liquid mixture may be utilized for particular reactants.

After the grafting of this non-silicon-containing organic molecule to the irradiated oxygenated resist film, excess non-silicon-containing organic molecular material is removed using the same procedure as previously described for removal of excess reactant in the first embodiment.

The silicon-containing compound is then reacted with the appropriate functional groups of the non-silicon-containing organic molecule either by using the vapor phase reactor in the manner described in the primary invention or by liquid phase reaction. In the latter case, the silicon-containing compound or a solution thereof is placed in the reaction vessel along with the microchip.

Typically, but not all-inclusive, of the functional groups of the non-silicon-containing organic molecule are: acids, alcohols, acid chlorides and epoxides. Typical, but not all-inclusive, of the silicon-containing compounds utilized to react with such functional groups are:

Hexamethyldisilazane, N-(2 aminoethyl)-3 aminopropyltrimethoxysilane, chlorotrimethylsilane, 3-glycidoxyupropyltrilmethoxysilane, 3-aminopropyltriethoxysilane, 3-aminopropyltrimethoxysilane, bis(trimethylsilyl)acetamide, and bis(trimethylsilyl)trifluoroacetamide.

The reaction is carried out at an appropriate temperature, e.g., about 50° C. to about 120° C., depending on the reactants utilized. The time period of the rection depends on both reaction kinetics and process conditions such as temperature and pressure. For example, when the non-silicon-containing organic molecule is acrylic acid and the silicon-containing compound is hexamethyldisilazane, and a liquid phase reaction is utilized at ambient pressure, adequate process conditions are a temperature of 60° C. and a time period of two hours. After the reaction, excess silicon-containing compound is removed using the technique described in the first embodiment.

Development of the microchip resist pattern is by the same dry process as that described in the first embodiment. The material used for plasma or reactive ion etching is typically oxygen. However, the oxygen may be diluted with argon or nitrogen in order to control the rate of etching. In addition, plasmas of air or moist air can also be utilized.

EXAMPLES

Figure 2:
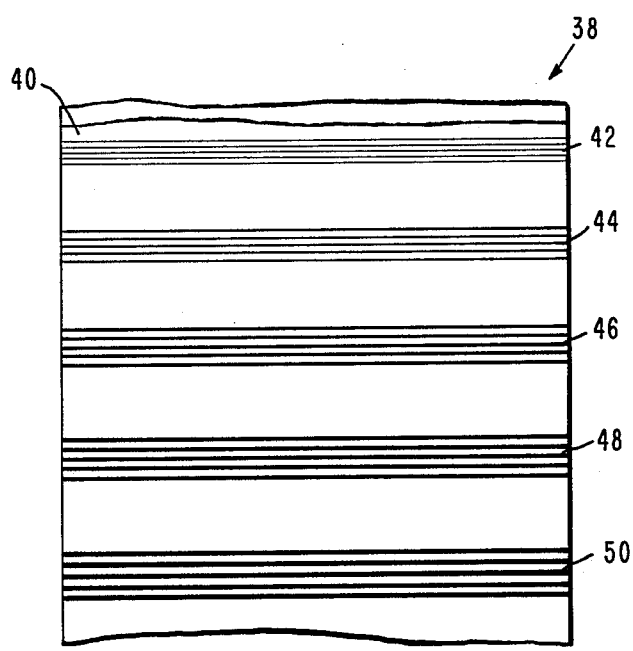
FIG. 2 depicts a schematic of a typical test specimen utilized to evaluate the grafting reactions and dry etching development process.

In order to provide a clearer understanding of the invention, a schematic depicting a microchip of the type utilized during the laboratory research effort is presented in FIG. 2. The pattern shown on the microchip is typical of that utilized in combination with an electron beam radiation source. A substrate approximately two inches in diameter was prepared. After the resist film 40 had been applied to the entire substrate major surface 38, a portion of the coated substrate was utilized for development of the microchip.

The film on the surface of the microchip was irradiated using electron beam or focused ion beam at low pressure to create an image consisting of sets of lines. FIG. 2 shows five of the twenty sets of lines typical in an electron beam image test pattern. Each set of lines was exposed to a different dosage of radiation, so that the effect of dosage on reactivity of the resist polymer film 40 could be measured. Typically, the applied radiation dosage was logarithmic beginning with the highest dosage at one edge of the substrate major surface, e.g., line set 50, and decreasing in subsequent line sets, so that line set 48 would be a lower dosage than line set 50, and line set 46 a lower dosage than line set 48, and so on, decreasing toward line set 42.

EXAMPLE I

A specific example of the first embodiment of the invention, wherein a negative resist polymer and an electron beam radiation source were utilized is presented below.

A silicon wafer approximately 2 inches in diameter was coated with poly(vinyl acetate) (PVA) by spin coating a 6% solution of PVA in toluene on a Headway spin-coater at 900 rpm. A uniform film 5300Å thick was produced after baking at 80° C. for one hour in a vacuum. A portion of this wafer, approximately one quarter of the original, was cut from the large piece in order to produce a microchip; the chip was exposed to a scanning electron beam to create two patterned images, each about 2 mm×2 mm in size, in the form of a series of sets of lines as shown in FIG. 2. The dosage applied to each set of lines decreased logarithmically along the wafer length from about $1\times10^{-}C/cm$ to $1\times10^{-10}$ C/cm. The width of an individual line was about 0.5 μm.

The irradiated microchip was immediately exposed to an oxygen-containing atmosphere (air) in order to generate peroxides and hydroperoxides at the organic free radical sites created as a result of the irradiation of the polymeric resist.

The imaged chip with associated peroxide and/or hydroperoxide functional groups was then placed in a vapor-phase grafting reactor consisting of a short column and a reactant-containing flask, each section of which could be heated independently. The chip was suspended in the column and vinyltrimethylsilane was placed in the flask. Air was removed from the column and flask through a vacuum outlet in the column wall. A freeze thaw technique was utilized to assist in removal of the oxygen. The freeze-thaw cycle was used three times.

After removal of oxygen, the system was sealed under vacuum. The flask containing the vinyltrimethylsilane was heated to 60° C. and the column to 120° C., and each reactor section was maintained at the given temperature for a two hour reaction period. The temperature of the flask was designed to produce boiling of the vinyltrimethylsilane in the flask initially. The temperature of the column was such that thermal decomposition of the peroxides and hydroperoxides associated with the polymeric resist was insured, and condensation in the column area prevented. Due to equipment limitations, the conditions given may not have been optimum for the reaction of grafting the vinyltrimethylsilane to the active free radical sites on the PVA resist film. Given high pressure equipment for the vapor phase grafting reactor, such process conditions as temperature, pressure and time might be adjusted to better facilitate the grafting reaction, including the degree of diffusion of the silicon-containing compound.

The grafted resist microchip was then removed from the reactor and excess vinyltrimethylsilane was removed by heating in a vacuum at 60° C. for a two hour period.

Dry development of the grafted resist copolymer image was by plasma etching. The microchip was placed in a Branson/IPC 3000 barrel reactor. An initial oxygen plasma etching at 300 watts and 1 Torr pressure for two sequential five minute periods resulted in formation of what appeared to be an $SiO_2$ film over the entire surface of the microchip. In an attempt to provide for better development of the image, a third exposure using a plasma of $CF_4$ combined with about 4% $O_2$ at 300 watts and 1 Torr for a period of about 100 seconds was utilzed to clean the overall surface of the microchip. This was followed by an additional exposure to oxygen plasma at 300 watts and 1 Torr for three sequential time periods totaling an additional 12 minutes. An image of well-defined lines with a clean background was achieved after such plasma etching.

EXAMPLE II

A specific example of the first embodiment of the invention wherein a positive resist polymer and a focused ion beam radiation source were utilized is presented below.

A silicon wafer was coated with polyisobutylene by spin coating using a 3.3% solution of 125,000 molecular weight polyisobutyle in xylene. A uniform film thickness of approximately 5,000 Å was obtained after baking.

A microchip sized specimen of the coated wafer was exposed to a focused silicon ion beam radiation source at low pressure to create a patterned image in the form of a series of lines. Each line was at a different ion beam radiation dosage. The radiation was comprised principally of a doubly ionized silicon at 70 to 80 Kv. The radiation dosage applied ranged from $1 \times 10^{15}$ silicon ions per square centimeter for the first line to about $2.5 \times 10^{16}$ silicon ions per square centimeter for the tenth line. At a radiation dosage of $1.5 \times 10^{15}$ silicon ions per square centimeter, the width of an individual line was about 0.5 micron.

The irradiated microchip was immediately exposed to an oxygen-containing atmosphere (air) in order to generate peroxides and hydroperoxides at the organic free radical sites created as a result of the irradiation of the polymeric resist.

The imaged chip with associated peroxide and/or hydroperoxide functional groups was then placed in the vapor-phase grafting reactor described in EXAMPLE I. γ-methacryloxypropyltrimethoxysilane was placed in the reactant flask, and after four freeze-thaw cycles to remove oxygen from the system, the system was sealed under vacuum. The reactant flask was then heated to about 60° C. and the column to about 145° C. Each reactor section was maintained at the specified temperature for a two hour reation period.

The grafted resist microchip was then removed from the reactor and excess γ-methacryloxypropyltrimethoxysilane was removed by heating in a vacuum at 80° C. for a one hour period.

The dry development of the resist image was carried out using plasma etching techniques. The microchip was placed in a Technics parallel plate reactor with oxygen at 200 watts and 0.8 Torr pressure for about 5 minutes. A slight film remained in the areas in which the nongrafted resist was to be removed. One additional etching period of about one minute was utilized. Good resist images were observed for resists focused ion beam irradiated with doses of between about $1.5 \times 10^{15}$ and about $1.5 \times 10^{16}$ silicon ions per square centimeter.

EXAMPLE III

A specific example of the second embodiment of the invention wherein a negative resist polymer and an electron beam radiation source were utilized under low pressure is presented below.

A silicon wafer was coated with poly(vinyl acetate) (PVA), and a microchip size sample was processed through the peroxide and hydroperoxide generation step as described in EXAMPLE I.

The imaged chip with associated peroxide and/or hydroperoxide functional groups was then placed in the vapor-phase grafting reactor described in EXAMPLE I. Acrylic acid was placed in the reactant flask, and after three freeze-thaw cycles to remove oxygen from the system, the system was sealed under vacuum. The reactant flask was then heated to about 40° C. and the column to about 140° C. Each reactor section was maintained at the specified temperature for a two hour reaction period.

The grafted resist microchip was then removed from the reactor, and excess acrylic acid was removed by heating in a vacuum at 80° C. overnight.

The monomer-free chip was then placed in a capped vial containing hexamethyldisilazane and the vial was held in a water bath at 60° C. for a two hour period.

Unreacted hexamethyldisilazane was removed by placing the chip in a vacuum at 80° C. for 30 minutes.

The dry development of the grafted resist terpolymer image was by plasma etching. The microchip was placed in the Branson/IPC 3000 barrel reactor. Oxygen plasma etching was carried out at 300 watts and 1 Torr pressure for two sequential two minute periods. The unexposed resist had been etched away after the 4 minutes of etching, leaving an image of straight lines with clean, sharply defined edges.

What is claimed is:

1. A method of producing a negative resist structure, which can be created utilizing a dry development process, comprising:
 (a) applying a polymeric resist film to a substrate;
 (b) irradiating said polymeric resist film using a precision radiation source selected from the group consisting of a scanning electron beam, masked ion beam and focused ion beam, at low pressure applied in a predetermined pattern at a dosage dependent on the reactivity of said polymeric resist film, thereby generating free radicals which lead to the formation of active sites which are capable of being converted to at least one of the class of peroxides and hydroperoxides on exposure to an oxygen-containing atmosphere;
 (c) exposing said irradiated polymeric resist film to an oxygen-containing atmosphere in order to convert at least a substantial proportion of said free radical active sites to at least one of the class of peroxides and hydroperoxides;

(d) thermally decomposing said class of peroxides and hydroperoxides to create free radicals associated with said polymeric resist film, and reacting such free radicals with a non-silicon-containing organic molecule which includes at least one functional group capable of reacting with said free radicals and at least one functional group capable of reacting with the desired silicon-containing compound;

(e) reacting said grafted resist film with said desired silicon-containing compound, so that said non-silicon-containing molecule acts as a grafting intermediary between said initial polymeric resist film and said silicon-containing compound; and (f) developing the irradiated, grafted resist into the desired negative resist structure utilizing an etching technique comprising an oxygen-containing plasma or reactive ion to remove the non-irradiated portion of said resist.

2. The process of claim 1 wherein said polymers to be used to create said resist film are selected from the group consisting of poly(vinyl acetate) and polyisobutylene.

3. The process of claim 1 wherein said non-silicon-containing organic molecule used as the intermediary grafting agent is acrylic acid.

4. The process of claim 1 wherein said silicon-containing compound to be grafted to said intermediary grafting agent is hexamethyldisilazane.

* * * * *